(12) United States Patent
Bhatt et al.

(10) Patent No.: US 6,178,093 B1
(45) Date of Patent: Jan. 23, 2001

(54) INFORMATION HANDLING SYSTEM WITH CIRCUIT ASSEMBLY HAVING HOLES FILLED WITH FILLER MATERIAL

(75) Inventors: Anilkumar Chinuprasad Bhatt, Johnson City, NY (US); Donald Herman Glatzel, New Milford, PA (US); Allen F. Moring, Vestal, NY (US); Voya Rista Markovich, Endwell, NY (US); Kostas Papathomas, Endicott, NY (US); David John Russell, Apalachin, NY (US)

(73) Assignee: International Business Machines Corporation, Armonk, NY (US)

( * ) Notice: Under 35 U.S.C. 154(b), the term of this patent shall be extended for 0 days.

(21) Appl. No.: 09/033,617

(22) Filed: Mar. 3, 1998

Related U.S. Application Data (62) Division of application No. 08/672,292, filed on Jun. 28, 1996, now Pat. No. 5,822,856.

(51) Int. Cl.[7] ................. H05K 1/11; H05K 1/03
(52) U.S. Cl. ............. 361/795; 361/748; 361/753; 361/792; 361/796; 174/255; 174/262; 174/264; 428/209; 428/210; 428/212; 428/321.3; 428/901; 29/852; 216/18; 427/97
(58) Field of Search ................... 361/748–752, 361/753, 757, 792, 793, 795, 796; 174/262–264, 266, 255; 257/700–703; 428/209, 210, 212, 304.4, 321.3, 901; 427/97; 216/17–19; 29/852; 156/90

(56) References Cited

U.S. PATENT DOCUMENTS

| | | | |
|---|---|---|---|
| 3,163,588 | 12/1964 | Shortt et al. | 205/114 |
| 4,127,699 | 11/1978 | Aumiller et al. | 428/461 |

(List continued on next page.)

FOREIGN PATENT DOCUMENTS

| | | |
|---|---|---|
| 471827 | 3/1992 | (JP) . |
| 4-71287 | 5/1992 | (JP) . |

OTHER PUBLICATIONS

Glenda Derman, "New Avenue for Microvias," Electronic Engineering Times, Mar. 18, 1996, p. 68.

(List continued on next page.)

* cited by examiner

Primary Examiner—Jayprakash N. Gandhi
Assistant Examiner—John B. Vigushin
(74) Attorney, Agent, or Firm—Pollock, Vande Sande & Amernick; Lawrence R. Fraley (57) ABSTRACT

An information handling system is provided which comprises:
a metal enclosure; at least one circuit assembly positioned within said metal enclosure, said circuit assembly including a circuitized substrate having at least one dielectric interior layer including a first surface and at least one hole therein; means for providing electrical power to said circuitized substrate within said metal enclosure; a filler material, wherein said filler material substantially fills said at least one hole within said at least one dielectric interior layer; a first wiring layer positioned on said first surface of said at least one dielectric interior layer, wherein said first wiring layer substantially covers said at least one hole having said filler material therein, said first wiring layer assisting in retaining said filler material within said at least one hole in said at least one dielectric interior layer; a first dielectric photoresist layer positioned on said first wiring layer and on said first surface of said at least one dielectric interior layer, wherein said first dielectric photoresist layer also includes at least one hole therein, said filler material also substantially filling said at least one hole within said first dielectric photoresist layer; a second wiring layer positioned on said first dielectric photoresist layer; wherein said second wiring layer includes a plurality of conductive pads as part thereof; and at least one external component electrically coupled to said conductive pads of said second wiring layer.

33 Claims, 8 Drawing Sheets

U.S. PATENT DOCUMENTS

| | | | |
|---|---|---|---|
| 4,135,988 | | 1/1979 | Dugan et al. ......................... 205/126 |
| 4,210,704 | | 7/1980 | Chandross et al. .................. 428/414 |
| 4,354,895 | | 10/1982 | Ellis ...................................... 216/20 |
| 4,383,363 | * | 5/1983 | Hayakawa et al. .................. 174/264 |
| 4,590,539 | | 5/1986 | Sanjana et al. ....................... 361/760 |
| 4,618,567 | | 10/1986 | Sullivan ............................... 430/311 |
| 4,731,503 | | 3/1988 | Kitanishi ............................ 174/88 R |
| 4,736,521 | * | 4/1988 | Dohya .................................... 29/852 |
| 4,747,968 | | 5/1988 | Gilleo ..................................... 252/514 |
| 4,791,248 | | 12/1988 | Oldenettel ............................ 174/265 |
| 4,822,523 | | 4/1989 | Prud'Homme ....................... 252/511 |
| 4,880,570 | | 11/1989 | Sanborn et al. ...................... 252/512 |
| 4,882,245 | | 11/1989 | Gelorme et al. ....................... 430/14 |
| 4,882,839 | | 11/1989 | Okada ..................................... 29/853 |
| 4,893,404 | | 1/1990 | Shirahata et al. ...................... 29/852 |
| 4,901,205 | * | 2/1990 | Landis et al. ......................... 361/753 |
| 4,904,414 | | 2/1990 | Peltz et al. ............................ 252/514 |
| 4,940,651 | | 7/1990 | Brown et al. ......................... 430/325 |
| 4,964,948 | | 10/1990 | Reed ...................................... 216/18 |
| 4,967,314 | | 10/1990 | Higgins, III ......................... 361/792 |
| 4,991,060 | | 2/1991 | Kawakami et al. .................. 361/778 |
| 4,999,136 | | 3/1991 | Su et al. ................................ 252/512 |
| 5,026,624 | | 6/1991 | Day et al. .......................... 430/280.1 |
| 5,028,743 | | 7/1991 | Kawakami et al. .................. 174/264 |
| 5,057,372 | | 10/1991 | Imfeld et al. ......................... 428/412 |
| 5,065,227 | | 11/1991 | Frankeny et al. .................... 257/778 |
| 5,070,002 | | 12/1991 | Leech et al. .......................... 430/325 |
| 5,082,595 | | 1/1992 | Glackin ................................. 252/511 |
| 5,117,069 | | 5/1992 | Higgins, III ......................... 174/261 |
| 5,200,026 | | 4/1993 | Okabe .................................... 216/48 |
| 5,210,941 | | 5/1993 | Turek et al. ............................ 29/852 |
| 5,220,724 | | 6/1993 | Gerstner ................................. 29/840 |
| 5,243,142 | | 9/1993 | Ishikawa et al. ..................... 174/262 |
| 5,262,247 | | 11/1993 | Kajiwara et al. ..................... 428/607 |
| 5,266,446 | | 11/1993 | Chang et al. ......................... 430/314 |
| 5,271,150 | | 12/1993 | Inasaka .................................. 29/852 |
| 5,287,619 | * | 2/1994 | Smith et al. ........................... 29/852 |
| 5,300,402 | | 4/1994 | Card, Jr. et al. .................. 430/280.1 |
| 5,304,252 | | 4/1994 | Condra et al. ........................... 134/2 |
| 5,319,159 | | 6/1994 | Watanabe et al. .................... 174/262 |
| 5,319,523 | * | 6/1994 | Ganthier et al. ..................... 361/753 |
| 5,321,210 | * | 6/1994 | Kimbara et al. ..................... 174/262 |
| 5,346,750 | | 9/1994 | Hatakeyama et al. ............... 428/209 |
| 5,348,574 | | 9/1994 | Tokas et al. ......................... 106/1.11 |
| 5,366,027 | | 11/1994 | Turek et al. .......................... 174/261 |
| 5,366,794 | * | 11/1994 | Nakao .................................. 428/209 |
| 5,373,629 | | 12/1994 | Hupe et al. ............................. 29/852 |
| 5,419,038 | * | 5/1995 | Wang et al. ............................ 29/852 |
| 5,427,895 | | 6/1995 | Magnuson et al. ................... 430/314 |
| 5,439,779 | | 8/1995 | Day et al. ......................... 430/280.1 |
| 5,450,290 | * | 9/1995 | Boyko et al. ......................... 361/792 |
| 5,463,190 | | 10/1995 | Carson et al. ........................ 174/259 |
| 5,473,120 | * | 12/1995 | Ito et al. ............................... 174/264 |
| 5,487,218 | | 1/1996 | Bhatt et al. ............................. 29/852 |
| 5,494,764 | | 2/1996 | Hyodo ..................................... 430/31 |
| 5,541,567 | | 7/1996 | Fogel .................................... 336/200 |
| 5,566,840 | | 10/1996 | Waldner et al. .................... 211/41.17 |
| 5,716,663 | * | 2/1998 | Capote et al. .......................... 427/97 |
| 5,744,758 | * | 4/1998 | Takenouchi et al. ................. 428/209 |
| 5,758,413 | * | 6/1998 | Chong et al. ........................... 29/852 |
| 5,780,143 | * | 7/1998 | Shimamoto et al. ................. 428/209 |
| 5,906,042 | * | 5/1999 | Lan et al. ................................ 29/852 |
| 5,956,843 | * | 9/1999 | Mizumoto et al. ..................... 29/852 |
| 5,977,490 | * | 11/1999 | Kawakita et al. .................... 174/255 |
| 6,033,764 | * | 3/2000 | Balents et al. ........................ 428/209 |

OTHER PUBLICATIONS

IBM Technical Disclosure Bulletin vol. 10, No. 5, Oct. 1967 "Printed Circuit Base" by J.H. Marshall, pp. 539–540.

IBM Technical Disclosure Bulletin vol. 11, No.7, Dec. 1968 "Face Protection of Printed Circuit Boards" by C.J. McDermott, p. 733.

INFORMATION HANDLING SYSTEM WITH CIRCUIT ASSEMBLY HAVING HOLES FILLED WITH FILLER MATERIAL

CROSS-REFERENCE TO RELATED APPLICATIONS

The present application is a divisional application of copending U.S. patent application S.N. 08/672,292 filed Jun. 28, 1996 and now U.S. Pat. 5,822,856.

FIELD OF THE INVENTION

This invention relates to high density computer systems using circuit board assemblies and manufacture of circuit board assemblies in which surface mount components and pin in hole components are attached to circuitized substrates by soldering component terminals into plated through holes and to connection pads on the substrate. More particularly this invention relates to methods for forming electrically conductive vias between buried wiring layers; forming multiple very fine external wiring layers; and organic materials made conductive by filling with conductive particles.

BACKGROUND

The following background is for convenience of those skilled in the art and for incorporating the listed citations by reference. The following background information is not an assertion that a search has been made, or that the following citations are analogous art, or that any of the following citations are pertinent or the only pertinent art that exists, or that any of the following citations are prior art.

The continued introduction of very high I/O and very high density surface mount components especially 0.2–0.4 mm gull wing leaded components, 40 mil ball grid array BGA modules, as well as the direct connection flip chips to circuit boards, has resulted in a need for very high density conductor fan out at these components. At the same time, decrease in the size of plated through holes PTHs which interconnect between wiring layers, has not kept up with these requirements for fan out. PTHs require substantial surface area which can not be easily reduced because seeding and plating require circulation of fluids in the holes. Reducing the size of connections between wiring layers has become critical for continued increase in circuit board density.

For such high density surface mount components, solder volummes are a critical process variable, but when components are attached to PTHs even those filled with solder, the solder volume between the terminals of the components and the PTHs can not easily be controlled.

Those skilled in the art are directed to the following references U.S. Pat. No. 4,967,314 to Higgins, III suggests filling via interconnect holes with a conductive epoxy. U.S. Pat. No. 3,163,588 to Shortt suggests stripable frisket, seeding and electroplating. *Face Protection of Printed Circuit Boards* by McDermott in *IBM Technical Disclosure Bulletin* Vol. 11 No. 7 December 1968 describes peelable coverings and pressing resin into plated through holes. *Printed Circuit Base* by Marshall in *IBM TDB* Vol. 10, No. 5, October 1967, describes a sensitizing material. U.S. Pat. No. 4,590,539 to Sanjana discloses epoxies, fillers, curing agents, and catalysts. U.S. Pat. No. 4,791,248 to Oldenettel suggests peel apart coverings, filling holes with resin, and planing off resin nubs. U.S. Pat. No. 4,893,440 to Shirahata discloses buried vias and electroconductive organic based paste. U.S. Pat. No. 4,964,948 to Reed suggests methods for seeding a substrate for electroplating. U.S. Pat. Nos. 4,991, 060 and 5,028,743 to Kawakami suggests filling through holes with electroconductive paste and buried vias. U.S. Pat. No. 5,065,227 to Frankeny suggests electrically conductive paste filling a via hole. U.S. Pat. No. 5,243,142 to Ishikawa discloses hole fill. U.S. Pat. No. 5,271,156 to Isasaka discloses manufacturing methods for multi-layer ceramic substrates including filling holes punched in green sheets with conductive paste. U.S. Pat. No. 5,319,159 to Watanabe suggests method of manufacturing a double sided printed wiring boards with resin filled PTHs. Japanese application 2-045998 suggests filling through holes with electroconductive thermosetting paste. Japanese application 2-184626 to Honda suggests using a novolac epoxy resin such as cresol novolac epoxy resin for a circuit board. U.S. Pat. No. 5,346,750 to Hatakeyama suggests a method to prevent bleed out of paste from a filled via. U.S. Pat. Nos. 4,354,895 to Ellis, 5,057,372 to Imfeld, and 5,262,247 to Kajiwara suggests a metal foil with a peel apart protective layer. U.S. Pat. Nos. 5200026 to Okabe and 5,266,446 to Chang suggest processes for forming thin film structures on substrates. U.S. Pat. Nos. 4,940,651 to Brown, 5,026,624 to Day, 5,070,002 to Leech, 5,300,402 to Card, 5,427,895 to Magnuson, and 5,439,779 to Day discuss photoresists. U.S. Pat. Nos. 4,127, 699 to Aumiller, 4,210,704 to Chandross, 4,731,503 to Kitanishi, 4,747,968 to Gilleo, 4,822,523 to Prud'Homme, 4,880,570 to Sanborn, 4,904,414 to Peltz, 4,999,136 to Su, 5,082,595 to Glackin, 5,220,724 to Gerstner, and 5,463,190 to Carson suggest various electrically isotopically conductive organic materials. *New Avenue for Microvias* in *Electronic Engineering Times* Mar. 18, 1996. p. 68 reports that Prolinx Labs Corp of San Jose, Calif. has developed an additive technology for blind and buried vias filled with conductive material. The proceeding citations are hereby incorporated in whole by reference.

SUMMARY OF THE INVENTION

In the invention of Applicants, holes in a first substrate structure are filled with an organic based conductive material and additional substrate layers are laminated to the substrate without causing the organic material to bleed out between the first substrate and the additional substrates during lamination. Also, metal may be plated over the organic material prior to laminating additional substrates onto the first substrate. The organic material may be filled with thermoconductive dielectric particles for better thermal performance or filled with electroconductive particles to provide conductive holes. Conductive vias in the additional substrates may be plated to connect to the conductive material in the filled holes. A cresol-novolac epoxy precursor may be filled with 70–80% by weight electroconductive particles such as copper and/or silver powder and cured and may subsequently be plated with copper. This allows conductive vias such as PTHs filled with electroconductive or thermoconductive material or holes filled with electroconductive material to be buried in the substrate and avoids excessive surface area from being utilized for vias between internal wiring layers. Also, the exterior substrate may be provided with photo-vias which require much less surface area than PTH's. The invention allows decreased wiring lengths between components so that a computer system utilizing such circuit boards will operate at a higher speed.

The invention includes a process for producing the circuit boards of the invention. In the process a peel apart structure including a copper foil and removable film is positioned with the copper foil in contact with the substrate and is laminated to a substrate. Then holes are formed in the substrate through the peel apart structure. Also, a sacrificial carrier is coated with an organic resin filled with conductive particles and then partially cured to form a carrier structure. The partially cured resin is positioned between the removable film and the sacrificial carrier and heat and pressure is applied to force the partially cured filler material into the holes with the peel apart structure acting as a mask. Finally, the removable film, the sacrificial carrier, and the conductive material remaining therebetween are peeled away leaving the copper foil laminated to the substrate.

The surface of the filler material is flattened by abrasion to the same level as the copper foil and the surface of the filler material is plated with copper. The copper foil is patterned to form a wiring layer then a dielectric photoresist is laminated to the wiring layer. Since the filler material is partially cured and covered by electroplated copper it does not bleed from the holes in between the wiring layer and the photoresist. Conductive photo-vias which are connected to the wiring layer, are formed through the photoresist and copper is deposited on the photoresist and patterned to form another wiring layer over the photoresist and also connected to the conductive vias.

The invention also includes the structures that result from the process including the substrate with the peel apart structure and carrier structure laminated thereto; the substrate with holes filled with the filler material; and the substrate with the photoresist laminated thereto with conductive vias and exterior wiring layer over the photoresist. The invention also includes an improved circuit board assembly including surface mount components placed at a higher density to allow faster circuit board speeds. Furthermore, the invention includes a computer system which operates faster due to the shorter signal flight times which result from the higher wiring densities of the invention.

Other features and advantages of this invention will become apparent from the following detailed description of the presently preferred embodiments of the invention illustrated by these drawings.

The following detailed description discusses specific examples and embodiments of the inventions including the best mode for utilizing the inventions, in such detail that anyone skilled in the art may utilize the invention without an undo amount of experimentation.

BEST MODE FOR CARRYING OUT THE INVENTION

In step 100 of FIG. 1(a) a circuit board substrate is formed. The substrate may be a ceramic substrate (e.g. alumina, or baryllia); or a metal substrate (e.g. Cu, Al, Invar, Covar, or Cu-Invar-Cu) covered with dielectric material (e.g. polyimide, or epoxy); or an organic substrate (e.g. epoxy) preferably filled with axially stiff fibers (fiberglass or polyaramida fibers) or a flexible substrate of dielectric polymer films (e.g. polyimide) and metal foils (e.g. copper). For example in FIG. 3 circuit board substrate 302 includes two buried metal wiring layers 304,306 (power and ground planes) and three dielectric layers 308,310,312. The dielectric layers may be ceramic or organic material.

In step 102 of FIG. 1(a) metal foil is laminated to a removable covering to form a peel apart structure. Preferably the metal of the foil is copper and the removable covering is a dry polyimide film or a second metal foil. A dry adhesive film may be provided between the metal foil and the removable foil. The adhesion between the adhesive film and the removable layer should be greater than the adhesion between the adhesive film and the metal foil or the adhesive film will have to be stripped off the foil after peeling. Also, for this process a layer of photoresist may be provided between the removable layer and the metal foil. After the removable layer is peeled off, the copper layer will be ready for photolithography. The adhesion between the removable covering should be sufficient to prevent separation during normal handling, but should be sufficiently low to prevent tearing the metal film or removable film during peeling and prevent delamination of the copper film from a substrate during peeling.

A peel apart copper structure is available from Gould.

Figure 3:
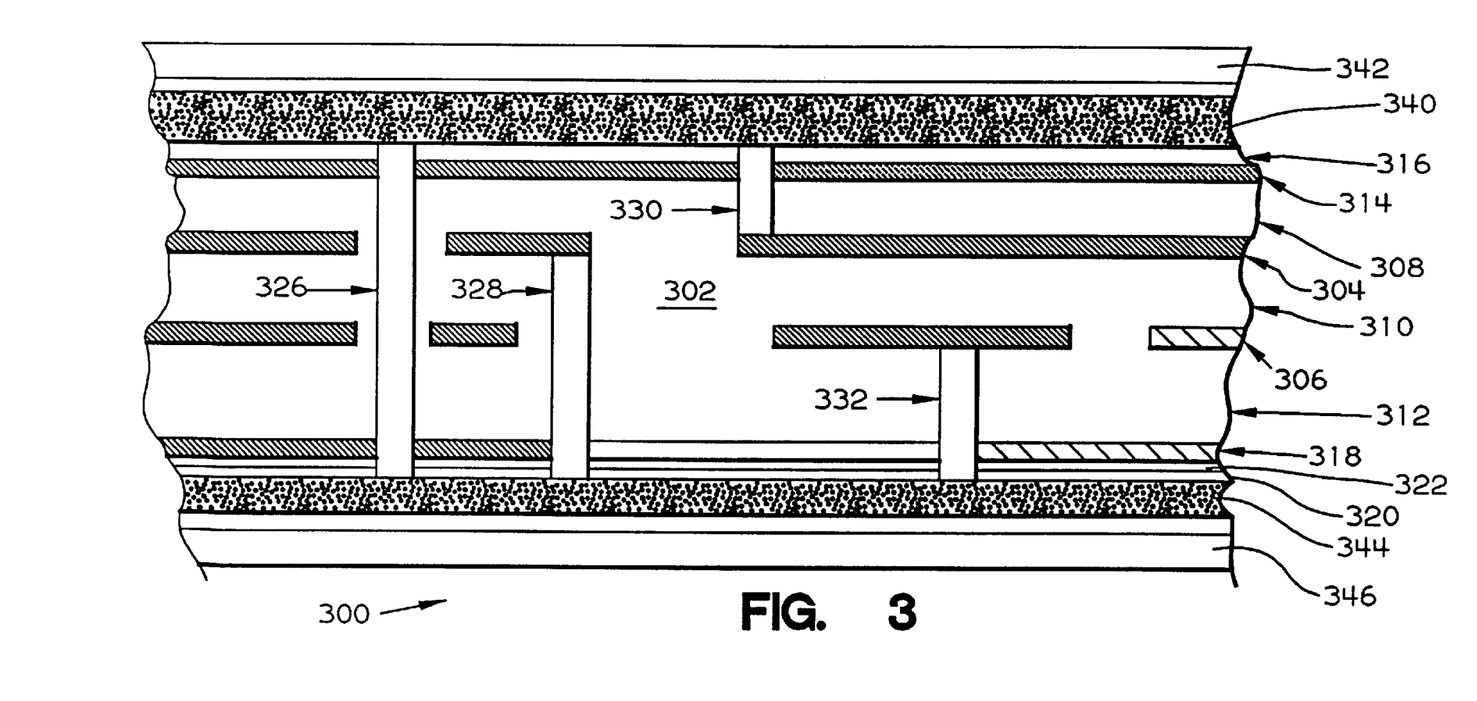
FIG. 3 schematically shows a portion of a substrate of the invention with holes through a peel apart structure and a transfer structure with filler material before lamination.

In step 104 the peel apart structure is positioned adjacent the circuit board with the copper foil against the circuit board substrate. In step 106 the peel apart structure is laminated to the circuit board substrate. The copper foil is laminated to a dielectric surface of the circuit board substrate. These steps may be performed by feeding the boards together with the peel apart structure between two heated rollers. FIG. 3, shows a peel apart structure laminated to each side of the substrate. On the top of the substrate a metal foil 314 is laminated to dielectric layer 308 and removable layer 316 is laminated to metal foil 314. On the bottom of the substrate metal foil 318 is laminated to dielectric layer 312 and removable layer 320 is laminated to foil 318 with intermediate layer 322 between the metal foil and removable film. The intermediate layer may be a photoresist which is left on the foil after peeling to provide for photolithographically patterning the foil. Alternately the intermediate layer may be an adhesive for lamination which is preferably peeled off with the removable layer.

In step 108 holes are drilled into the substrate through the peel apart structure. As shown in FIG. 3, hole 326 extends through the substrate and through both peel apart structures laminated to the surfaces of the substrate. Holes 328,330, 332 are blind holes or cavities that preferably extend through the peel apart structure and into the substrate to buried wiring layers as shown. The holes are 4 to 24 mils in size, preferably 8 to 16 mils, most preferably about 12 mils. Filling holes as small as 2 mils may be possible if the substrate is thin and the process is optimized. The through holes may be plated at this time if a dielectric filler material is to be used to provide filled PTHs.

In step 110 of FIG. 1(b) an organic filler material is prepared. The organic material may be filled with electroconductive particles to form an organic based conductive material. Alternately, the organic material may be filled with thermoconductive dielectric particles to increase thermal performance. The organic material may be a thermoset or a thermoplastic resin and preferably is an adhesive (epoxy or silicons) and more preferably 20% to 80% weight phenol cured cresol-novolac resin. Methyl ethyl katons solvent may be added to the organic material to achieve suitable viscosity for coating. A tertiary amine catalyst is added for curing. Electroconductive particles may include metal or carbon and may include silver flakes or silver particles but are preferably copper particles. Alternatively the particles may include a transient liquid phase TLP particle system. Preferably the coefficient of thermal expansion of the filler material matches the coefficient of thermal expansion of the substrate in the direction of the through hole. Preferably conductive particles have a maximum size of 6 microns.

TLP systems when initially heated form a molten eutectic alloy portion which immediately resolidifies because the molten alloy portion is in contact with a supply on one of the constituent elements of the alloy which element dissolves into the molten alloy until the molten alloy is no longer eutectic and melting temperature is increased. TLP particle systems for organic based electroconductive materials are based on solder alloys in which the elements of the solder alloys are not yet alloyed. For example binary eutectic solders are alloys of a first metal and a second metal and a binary TLP particle system may contain particles of the first metal coated with the second metal or the first metal coated with the eutectic alloy of two metals or particles of the first metal mixed with particles of a eutectic alloy of the two metals or a mixture of coated particles and uncoated particles. Trinary and quatrinary solders can also be used. TLP particle systems when heated initially form a melted eutectic portion at the particle surface to connect the particles together, but the core of the particles include non-eutectic amounts of one of the metal constituents of the alloy so that as more of the particle dissolves into the molten surface the molten alloy becomes non-eutectic and the melting temperature of the molten portion rises until it solidified even at constant temperature. For example lead particles coated by a tin layer having 3% of the mass of the particle when heated to 180° C., will initially form a molten coating of eutectic 63/37% Sn/Pb alloy, allowing adjoining particles to connect together. As more of the Pb core of the particle dissolves into the molten portion the lead content of the molten alloy increases and melting temperature increases and the molten portion solidifies. Tin particles coated with lead will react similarly and mixtures of pure Pb particles and eutectic Pb/Sn particles will also react similarly where dissimilar particles meet.

In step 112 a sacrificial carrier is coated with the filler material to form a transfer structure and in step 114 the filler material is heated until partially cured. The sacrificial carrier may be a metal foil or an organic film such as polyimide. For thermosets containing solvents partial curing comprises heating for driving out the volatile solvents and for epoxies partial curing includes heating to form long polymer chains until a B-stage is reached. In step 116 the transfer structure is positioned adjacent to the substrate with the filler material against the removable layer of the peel apart structure. FIG. 3 shows a transfer structure on each side of substrate 302. On the top surface of the substrate, filler material 340 is deposited on sacrificial layer 342 and the transfer structure is positioned with the filler material against removable layer 316 of the peel apart structure. On the bottom surface of the substrate, filler material 344 is deposited on sacrificial layer 346 and the transfer structure is positioned with filler material 344 against removable layer 320 of the peel apart structure.

In step 118 the transfer structure is laminated to the substrate with sufficient heat and pressure to force the filler material to fill the holes. For electroconductive filler material the holes must be filled sufficiently to provide electrical connection between the ends of the filled holes. A lamination press is preferred for this lamination step because of the high pressures and relatively high thickness of the transfer structure.

Figure 4:
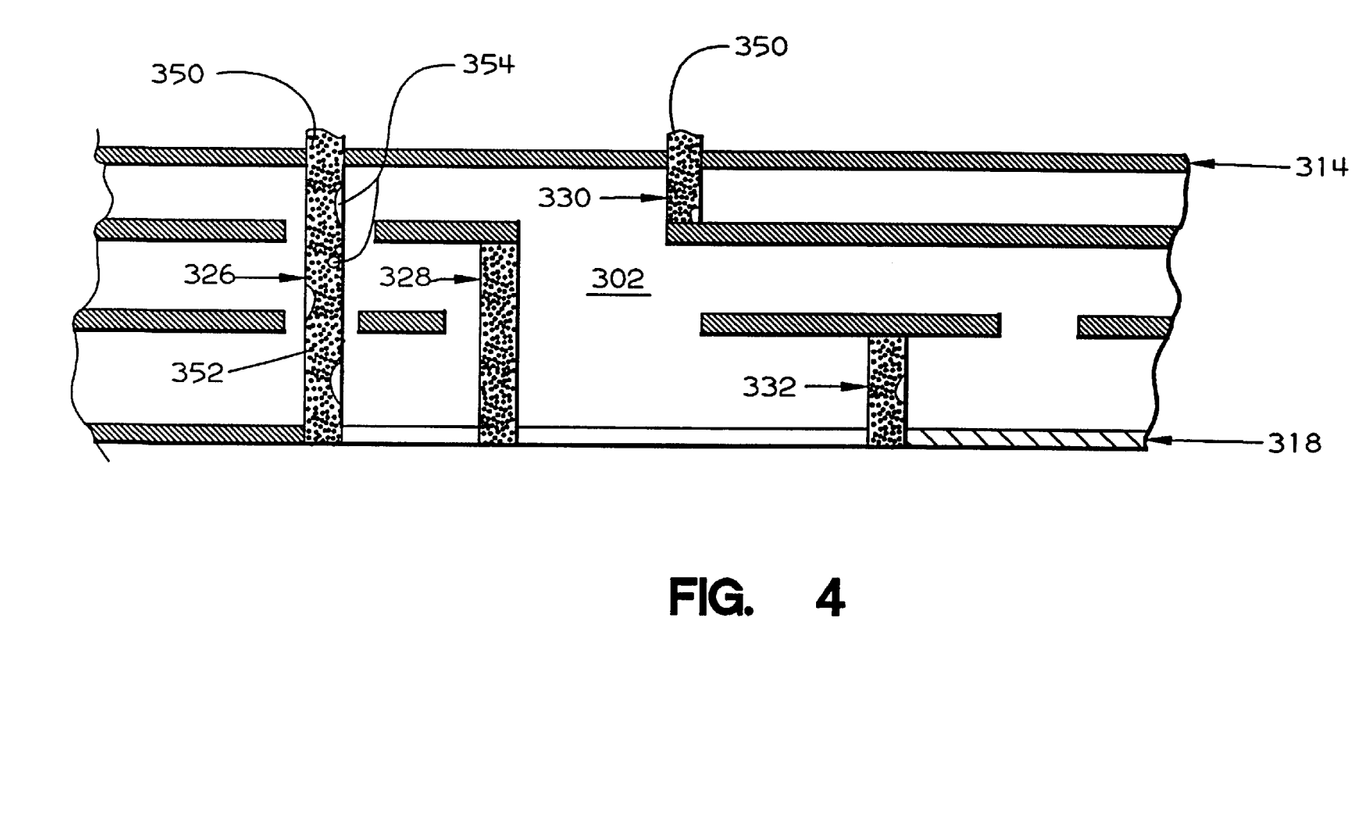
FIG. 4 schematically shows the portion of the substrate of FIG. 3 with holes substantially filled with electroconductive material after lamination and peeling apart.

In step 120 of FIG. 1(c) the removable layer along with the sacrificial layer and filler material remaining between the layers is peeled off the substrate. FIG. 4 shows the resulting structure with nubs 350 of filler material extending from the holes. In this view the filler material 352 in through hole 326 is continuous from metal layer 314 to metal layer 318 to provide electrical interconnection. Any voids 354 are sufficiently small that electrical conduction is not significantly affected.

In step 122 the nubs are abraded off even with the external surface the copper foil. This is shown in FIG. 4 where nubs 350 are shown extending above the level of the copper foil 314 and where any filler material extending beyond foil layer 318 has been removed by abrasion (sanding). Alternately the material may be removed by planing.

If only one surface wiring layer is desired on each side of the substrate and unfilled plated through holes PTHs are desired for example to attach pin in hole PIH components, then holes should be drilled through the substrate and seeded for electroless metal plating before step 124.

Figure 5:
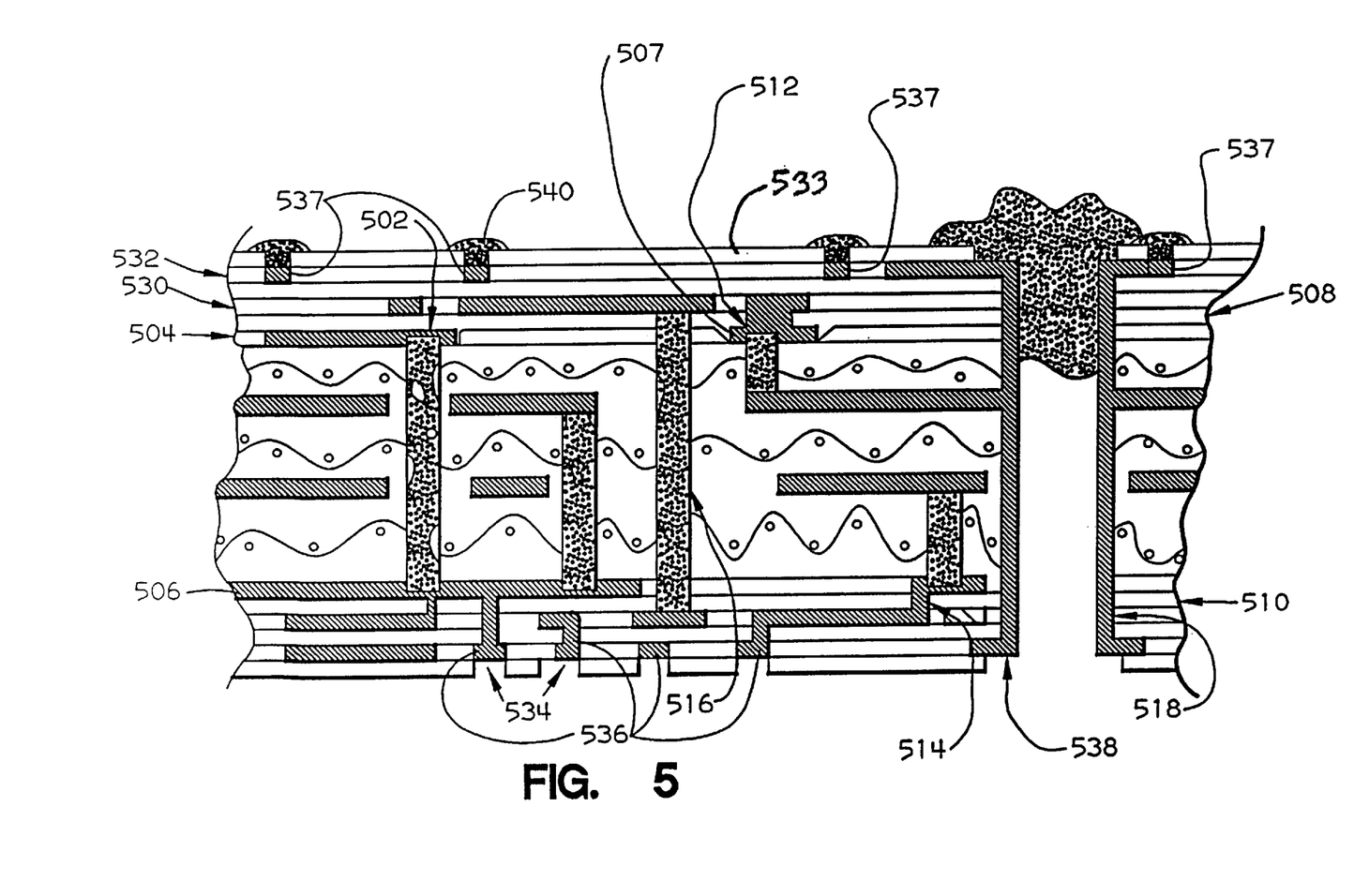
FIG. 5 schematically shows the portion of the substrate of FIG. 3 after additional layers have been formed.

In step 124 metal is deposited on the filler material and metal foil to form a continuous layer of metal on each of the major surfaces of the substrate. For electroconductive filler material the conductive material may be prepared for plating by exposing conductive particles on the surface of the conductive material. The deposition may include sensitizing or seeding the surface of the filler material and electrolessly plating to form a thin coating of copper on the surface of the filler material. Preferably the deposition includes electroplating of copper onto the filler material on both major surfaces. This step seals the filler material into the holes and for electroconductive material provides a better electrical connection than the connection between the conductive material and the walls of the holes through the metal film. Preferably the plating continues until 0.5 to 2 mils of copper are deposited on the walls of the plated through holes and about 0.2 to 1.0 mils are deposited on the surface of the filler material in the holes. FIG. 5 shows the metal plated over the filler material for example at 502.

The metal surface may be vapor blasted and/or treated in a chloriting bath to increase adhesion to a photoresist. Also, microetching or pumice washing may be used to improve adhesion.

In step 130 of FIG. 1(d), a layer of first photoresist is formed over the continuous layer of metal. A liquid precursor may be spun on the surface and cured or more preferably a dry film photoresist 0.1 to 4 mils thick is used. In step 132 the photoresist is exposed to a pattern of electromagnetic radiation or a particle beam. The radiation may be produced in a pattern using a laser or a source of visible light, UV light, or X-ray which may be directed through a mask to form a pattern. The type of radiation or particle beam depends on equipment availability and the chemistry of the photoresist. In step 134 the photoresist is developed to form a first pattern of photoresist. The pattern covers portions of the metal layer which will form a wiring layer on the surface of the substrate. Other portions of the continuous metal layer are exposed and in step 136, the exposed portions are etched away to form a first wiring layer (signal layer). For copper the preferred etchant is cupric chloride but other etchants used for etching copper in circuit board manufacture may be used. The first wiring layer 504 and 506 is shown in FIG. 5. Then in step 138 of FIG. 1(d) the first photoresist is stripped away for example by rinsing with deionized water. The photoresist may be a positive resist in which case exposed portions become softened and are rinsed away to form the photoresist pattern and after etching the remaining photoresist is exposed to radiation and rinsed away to strip the photoresist off the metal layer. Alternatively, for negative photoresists the exposed portions become hardened and the unexposed portions are rinsed away. Then the first photoresist pattern is removed using a solvent or etchant.

Preferably in wiring layers 504,506 a narrow metal land surrounds the exterior ends of the holes filled with filler material as at 507 in FIG. 5.

If only one external wiring layer is desired on each side of the substrate then the circuit board may be completed by covering each side with a layer of solder resist and forming windows in the solder resist for surface mount connection pads. Otherwise if more layers are desired then processing continues as follows.

The following steps 140–166 may be performed sequentially multiple times as desired, to provide multiple wiring layers on each of the surfaces of the substrate.

In step 140 in FIG. 1(e) a layer of second photoresist is formed over the wiring layer. Again, a dry film photoresist is preferred. The second photoresist can be the same material or a different material than the first photoresist and either a positive or negative photoresist. Preferably the second photoresist is a photoimagable and can be treated for use as a permenent dielectric layer (photoimagable dielectric) that can withstand solder reflow temperatures.

If desired, additional holes filled with filler material such as hole 516 in FIG. 5, may be formed some time between steps 140 and 150 by laminating a peelable layer over the photoimagable dielectric; drilling holes through the peelable layer, photoimagable dielectric, and into the substrate; plating the holes with metal if desired; laminating another transfer structure to the peelable layer with sufficient heat and pressure to force the filler material into the holes; and peeling away the peelable layer and transfer structure.

In step 142 the photoimagable dielectric is exposed to a pattern of electromagnetic radiation or particle beam, and in step 144 the photoimagable dielectric is developed to form a corresponding pattern of photoresist. Preferably as shown in FIG. 5, the pattern of photoresist layers 508,510 consist only of via holes such as at 512,514 that extend through the photoresist over pads or conductors of the first wiring layer. In step 146 the photoresist is treated to make it permanent for example by baking a positive photoresist so that it is not affected by subsequent exposure to light. If components need to be attached by solder reflow the permanent photoresist layer must be capable of withstanding those temperatures. Other attachment methods such as ECA component attach require much lower cure temperatures. This step may be required for some negative photoresists so that subsequent plating, etching, developing steps do not affect the photoresist. Other negative photoresists may not require this step.

In step 150 in FIG. 1(f) a third layer of photoresist is formed over the photoimagable dielectric, and in step 152 the third photoresist is exposed to a pattern of electromagnetic radiation or particle beam. Again this is commonly done by directing light (visible, or UV) from a source through a mask. In step 154 the third photoresist is developed to form a third photoresist pattern.

The following steps 156 and 158 are performed when PIH components are required when forming the last wiring layer on each surface of the substrate. For example in FIG. 5 three external wiring layers are provided and PTHs 518 are only provided when forming the final wiring layer.

In step 156 of FIG. 1(f) holes are formed through the substrate to provide interconnection between wiring layers and/or PTHs for PIH components. The holes may be formed by laser drilling, punching, or by mechanical drilling using a drill bit. In step 158 the holes are treated to remove debris and improve electrical connection. For holes mechanically formed using a drill bit, the holes should be deburred and chemically cleaned to remove smear from internal wiring layers for electrical connection thereto.

In step 160 of FIG. 1(g) the surface of the photoimagable dielectric as well as the walls of the photo-vias and any holes for PIH components, are seeded for electroless metal plating. In step 162 a thin coat of metal is formed on the seeded surfaces by electroless plating. In step 164 a thicker metal coating is formed by electroplating. Preferably the thicker coating is copper with a thickness of 0.2 to 4 oz of Cu per square foot, more preferably about 1 oz (0.5–2 oz) per square foot. Preferably the copper is at least 1 mil thick in any plated through holes. Finally in step 166 the layer of third photoresist is stripped to remove metal plating covering the third photoresist and form a second wiring layer. Alternatively, the surface of the substrate may be flattened (planarized) using chemical-mechanical polishing to remove any metal plating the third photoresist to form the second wiring layer.

A second wiring layer 530 is shown in FIG. 5 which is not an external wiring layer. In order to produce the structure of FIG. 5 after steps 140–166 were all completed (except steps 156 & 158 were not done the first time) then the steps were all performed a second time to produce a third wiring layer 532.

In step 170 of FIG. 1(h) a layer of solder resist 533 is formed over the exterior wiring layer 532 as shown in FIG. 5. The solder resist may be applied as a liquid or paste by roller coating, curtain coating or screening onto the surface or dry film may be laminated to the surface. Then in step 172 of FIG. 1(h) windows 534 are formed in the solder resist over pads 536 and 537 for surface mount components and lands 538 for PIH components. Preferably, the photoresist is a photoimagable dielectric and windows are photoimaged and then the dielectric may be cured to make it permanent. For screened solder resist the windows are formed during screening onto the wiring layer. Pads 536 are preferably spaced 5 to 15 mils apart for connection of a flip chip, or 10 to 30 mils for leaded components and pads 537 are spaced at 30 to 50 mils for connection of a BGA, Ball Grid Array, module.

The circuitized substrate of the invention has improved wirability due to reduced via diameters and reduced land diameters of the first and second wiring layer. In step 180 of FIG. 1(i) joining material 540 (FIG. 5) is screened into the windows onto the pads for surface mount connection. Alternately the joining material may be screened onto the component terminals or the pads or terminals may otherwise be coated with joining material. The joining material may be an ECA with conductive particles or a TLP system or a solder paste or a solder alloy may be provided on the pads or terminals and a flux applied to the pads and/or terminals for soldered connection. Solder paste consists of liquid flux and metal particles which melt during reflow heating to form molten solder alloy such as eutectic Pb/Sn solder (e.g. Pb and 30–80% Sn preferably 55–70% Sn). In step 182 the terminals (balls, leads, pads) of surface mount components are positioned at the pads (close enough for reflowed connection between the pads and the terminals). In step 184 the joining material is cured. For solder paste the curing includes heating the paste above the melting temperature of the solder alloy. In step 186 the joining material is cooled to form solid joints between the terminals and pads.

Figure 1:
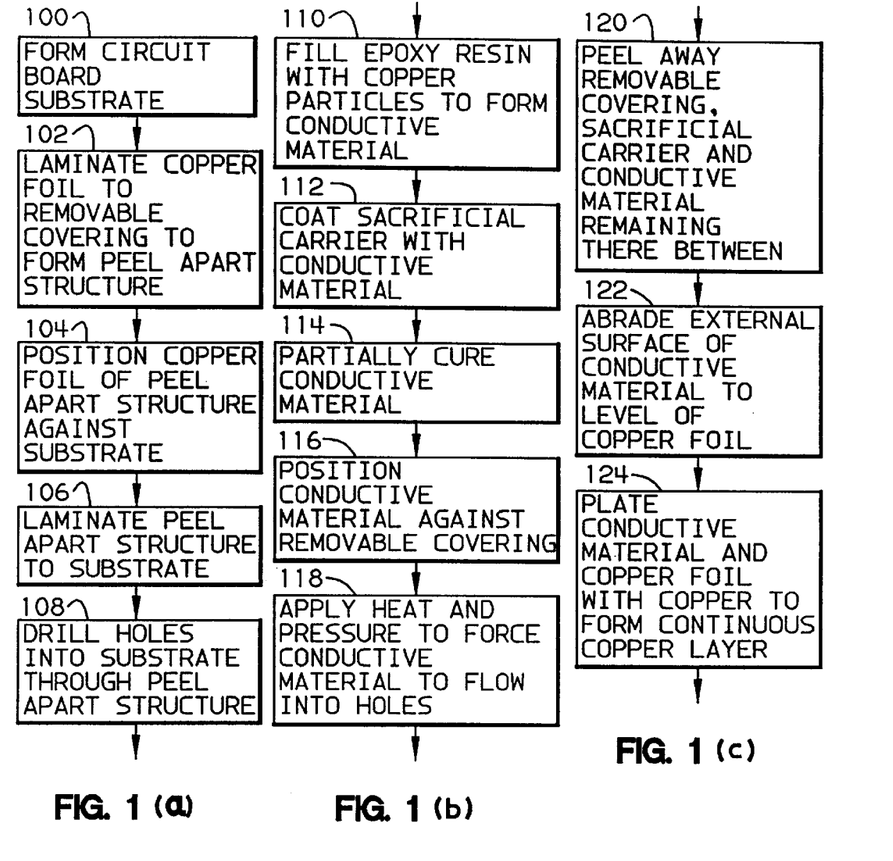
FIGS. 1(a)–1(j) is a flow diagram illustrating a specific embodiment of the process of the invention.

When PIH components are required then steps 190–196 of FIG. 1(*j*) are also performed. In step 190 PIH components are placed on the substrate with pins or leads of the component in PTHs. In step 192 flux is applied into the holes to provide a more solder wettable metal surface. In step 194 the substrate is moved over a wave or fountain of solder in contact with the molten solder which wets to lands on the bottom of the board and fills the PTHs by capillary action (surface tension). Then the solder is cooled to form solid joints of solder alloy.

Alternatively, for PIH components solder paste may be applied to the top surface of the substrate over the lands around the PTHs and the pins of the components inserted through the paste deposits. Then during reflow for the surface mount components the solder paste reflows to form solder alloy which fills up the respective PTH to connect the PIH components.

Figure 2A:
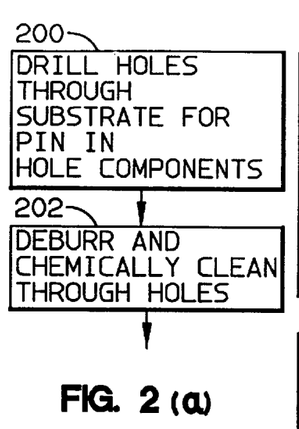
FIGS. 2(a)–2(c) is another flow diagram illustrating an alternative specific embodiment of the invention.
Figure 2B:
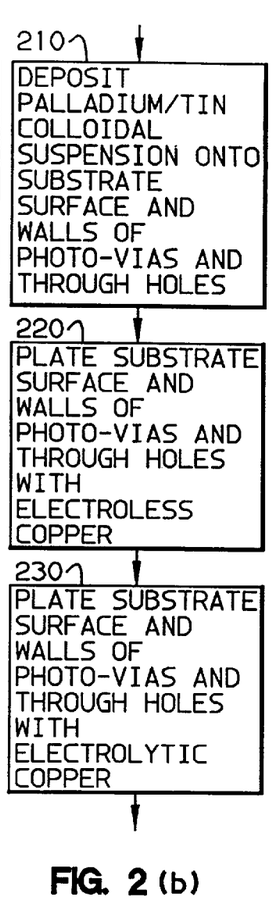
Figure 2C:
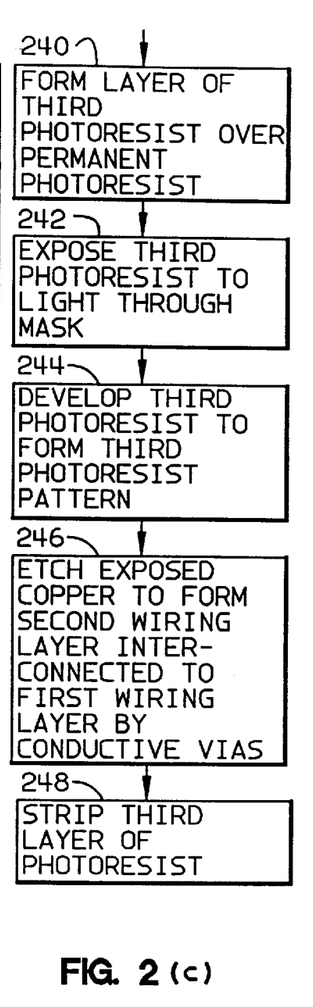

FIGS. 2(*a*)–2c illustrate an alternative embodiment for the steps 140–166 in FIGS. 1(*e*)–1(*g*) of the process for forming additional wiring layers such as a second wiring layer on each side of the substrate. FIGS. 1(*e*)–1(*g*) illustrate an additive process and FIGS. 2(*a*)–2(*c*) illustrate a subtractive embodiment.

Steps 200–202 in FIG. 2(*a*) are similar to steps 156–158 and the above discussion thereof applies. Steps 210–230 are similar to steps 160–164 in FIG. 1(*g*) and the above discussion thereof applies. Steps 240–244 are similar to steps 150–154 above in FIG. 1(*f*) and the above discussion applies. In step 246, exposed copper is etched to form a second wiring layer interconnected to the first wiring layer by conductive vias. In step 248, the third layer of photoresist is stripped.

Figure 6:
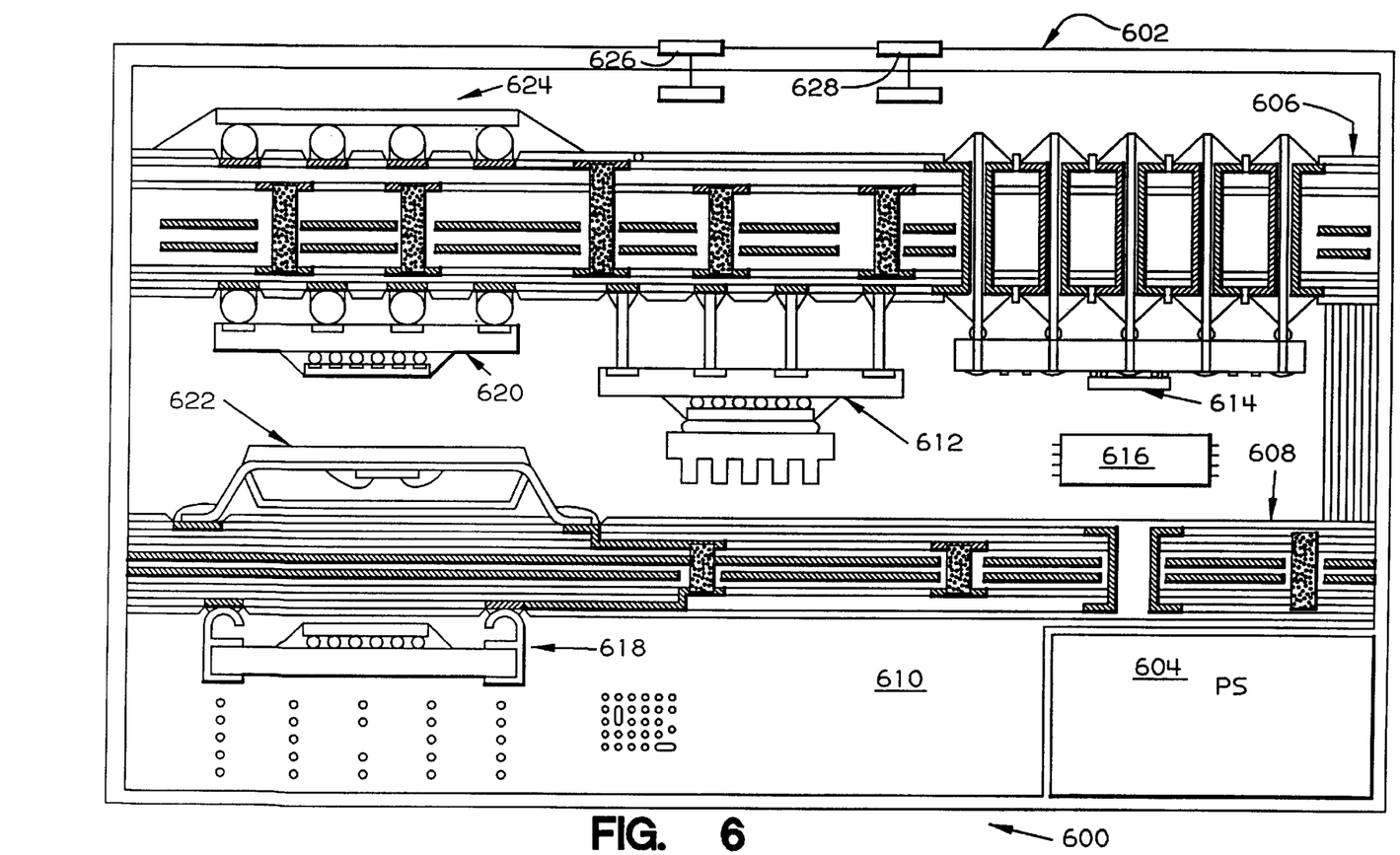
FIG. 6 schematically shows circuit assemblies of the invention assembled into an enclosure with a power supply to form the computer system of the invention.

FIG. 6 illustrates computer system 600 of the invention with increased performance due to higher component densities and resulting shorter signal flight time. The system includes an enclosure 602 in which a power supply 604 and one or more circuit boards 606,608,610 are mounted. The circuit boards communicate through interconnect bus 612. The circuit boards include multiple components including pin grid array module 614, thin small outline package 616, ceramic J-lead component 618, ball grid array module 620, quad flat pack 622, flip chip 624, column grid array module 626. The components includes one or more CPUs, dynamic RAMS, static RAMS, and I/O processors connected to ports 626, 628 for communication with computer peripherals such as keyboards, mice, displays, printers, modems, networks.

Although the invention has been described specifically in terms of preferred embodiments, such embodiments are provided only as examples. Those skilled in the art are expected to make numerous changes and substitutions, including those discussed above, in arriving at their own embodiments, without departing from the spirit of the present invention. Thus, the scope of the invention is only limited by the following claims.

We claim:

1. An information handling system, comprising:
   a metal enclosure;
   at least one circuit assembly positioned within said metal enclosure, said circuit assembly including a circuitized substrate having at least one dielectric interior layer including a first surface and at least one hole therein;
   means for providing electrical power to said circuitized substrate within said metal enclosure;
   a filler material, wherein said filler material substantially fills said at least one hole within said at least one dielectric interior layer; and wherein said filler material comprises an organic base and at least one member selected from the group consisting of electroconductive particles and thermoconductive particles and wherein said organic base is about 20 percent to about 30 percent by weight of said filler material;
   a first wiring layer positioned on said first surface of said at least one dielectric interior layer, wherein said first wiring layer substantially covers said at least one hole having said filler material therein, said first wiring layer assisting in retaining said filler material within said at least one hole in said at least one dielectric interior layer;
   a first dielectric photoresist layer positioned on said first wiring layer and on said first surface of said at least one dielectric interior layer, wherein said first dielectric photoresist layer also includes at least one hole therein, said filler material also substantially filling said at least one hole within said first dielectric photoresist layer;
   a second wiring layer positioned on said first dielectric photoresist layer, wherein said second wiring layer includes a plurality of conductive pads as part thereof; and
   at least one external component electrically coupled to said conductive pads of said second wiring layer.

2. The information handling system recited in claim 1 further comprising a central processing unit, a random access memory means for directing said central processing unit, and an input/output means for receiving input signals and transmitting output signals from said information handling system.

3. The information handling system recited in claim 1 wherein said dielectric interior layer comprises a material selected from the group consisting of ceramic and an organic compound.

4. The information handling system recited in claim 1 wherein said at least one hole within said at least one dielectric interior layer extends substantially through said dielectric interior layer.

5. The information handling system recited in claim 4 wherein said at least one hole within said at least one first dielectric photoresist layer includes a plated layer thereon.

6. The information handling system recited in claim 1 wherein at least two of said conductive pads are spaced apart from about 5 mils to about 50 mils.

7. The information handling system recited in claim 1 wherein said at least one hole within said at least one dielectric interior layer includes a diameter of about 2 mils to about 24 mils.

8. The information handling system recited in claim 1 wherein said organic base further comprises a resin selected from the group consisting of thermoplastic and thermoset resins.

9. The information handling system recited in claim 8 wherein said resin is a thermoplastic resin and further comprises an adhesive selected from the group consisting of epoxy and silicone.

10. The information handling system recited in claim 9 wherein said epoxy comprises epoxy-novolac resin.

11. The information handling system recited in claim 1 wherein said electroconductive particles comprise a material selected from the group consisting of metal and carbon.

12. The information handling system recited in claim 11 wherein said metal is selected from the group consisting of silver, copper, tin, lead and alloys thereof.

13. The information handling system recited in claim 1 wherein said electroconductive particles or thermoconductive particles are about 70 percent to about 80 percent by weight of said filler material.

14. The information handling system recited in claim 1 wherein said dielectric photoresist layer is comprised of permanent photoresist.

15. The information handling system recited in claim 14 wherein said circuitized substrate further includes a second dielectric photoresist layer positioned on said first dielectric photoresist layer and on said second wiring layer, said second dielectric photoresist including a third wiring layer positioned on said second dielectric photoresist layer.

16. The information handling system recited in claim 15 wherein said first wiring layer and said third wiring layer are electrically coupled.

17. The information handling system recited in claim 1 wherein said at least one external component is selected from the group consisting of a flip chip, a leaded component, a BGA module and combinations thereof.

18. An information handling system, comprising:
a metal enclosure;
at least one circuit assembly positioned within said metal enclosure, said circuit assembly including a circuitized substrate having at least one dielectric interior layer including a first surface and at least one hole therein;
means for providing electrical power to said circuitized substrate within said metal enclosure;
a filler material, wherein said filler material substantially fills said at least one hole within said at least one dielectric interior layer;
and wherein said filler material comprises an organic base and at least one member selected from the group consisting of electroconductive particles and thermoconductive particles, and wherein said electroconductive particles or said thermoconductive particles are about 70 percent to about 80 percent by weight of said filler material;
a first wiring layer positioned on said first surface of said at least one dielectric interior layer, wherein said first wiring layer substantially covers said at least one hole having said filler material therein, said first wiring layer assisting in retaining said filler material within said at least one hole in said at least one dielectric interior layer;
a first dielectric photoresist layer positioned on said first wiring layer and on said first surface of said at least one dielectric interior layer; wherein said first dielectric photoresist layer also includes at least one hole therein, said filler material also substantially filling said at least one hole within said first dielectric photoresist layer;
a second wiring layer positioned on said first dielectric photoresist layer; wherein said second wiring layer includes a plurality of conductive pads as part thereof; and
at least one external component electrically coupled to said conductive pads of said second wiring layer.

19. The information handling system recited in claim 18 further comprising a central processing unit, a random access memory means for directing said central processing unit, and an input/output means for receiving input signals and transmitting output signals from said information handling system.

20. The information handling system recited in claim 18 wherein said dielectric interior layer comprises a material selected from the group consisting of ceramic and an organic compound.

21. The information handling system recited in claim 18 wherein said at least one hole within said at least one dielectric interior layer extends substantially through said dielectric interior layer.

22. The information handling system recited in claim 21 wherein said at least one hole within said at least one first dielectric photoresist layer includes a plated layer thereon.

23. The information handling system recited in claim 18 wherein at least two of said conductive pads are spaced apart from about 5 mils to about 50 mils.

24. The information handling system recited in claim 18 wherein said at least one hole within said at least one dielectric interior layer includes a diameter of about 2 mils to about 24 mils.

25. The information handling system recited in claim 18 wherein said organic base further comprises a resin selected from the group consisting of thermoplastic and thermoset resins.

26. The information handling system recited in claim 25 wherein said resin is a thermoplastic resin and further comprises an adhesive selected from the group consisting of epoxy and silicone.

27. The information handling system recited in claim 26 wherein said epoxy comprises epoxy-novolac resin.

28. The information handling system recited in claim 18 wherein said electroconductive particles comprise a material selected from the group consisting of metal and carbon.

29. The information handling system recited in claim 28 wherein said metal is selected from the group consisting of silver, copper, tin, lead and alloys thereof.

30. The information handling system recited in claim 18 wherein said dielectric photoresist layer is comprised of permanent photoresist.

31. The information handling system recited in claim 30 wherein said circuitized substrate further includes a second dielectric photoresist layer positioned on said first dielectric photoresist layer and on said second wiring layer, said second dielectric photoresist including a third wiring layer positioned on said second dielectric photoresist layer.

32. The information handling system recited in claim 28 wherein said first wiring layer and said third wiring layer are electrically coupled.

33. The information handling system recited in claim 18 wherein said at least one external component is selected from the group consisting of a flip chip, a leaded component, a BGA module and combinations thereof.

* * * * *

UNITED STATES PATENT AND TRADEMARK OFFICE
CERTIFICATE OF CORRECTION

PATENT NO. : 6,178,093 B1
DATED : January 23, 2001
INVENTOR(S) : Anilkumar Chinuprasad Bhatt, Donald Herman Glatzel, Allen F. Moring, Voya Rista Markovich, Kostas Papathomas, David John Russell.

It is certified that error appears in the above-identified patent and that said Letters Patent is hereby corrected as shown below:

Page 2,
Under U.S. Patent Documents, for patent number 5,065,227 the date "11/1991" should be -- 12/1991 --.

Sheet 4, in FIG. 2 (a), "DEBURR" should read -- DEBUR --.

Signed and Sealed this

Second Day of October, 2001

Attest:

NICHOLAS P. GODICI
Attesting Officer
Acting Director of the United States Patent and Trademark Office